United States Patent
Engl (10) Patent No.: US 6,509,792 B2
(45) Date of Patent: Jan. 21, 2003

(54) CIRCUIT AND METHOD FOR ATTENUATING OR ELIMINATING UNDESIRED PROPERTIES OF AN OPERATIONAL AMPLIFIER

(75) Inventor: Bernhard Engl, Miesbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/892,961

(22) Filed: Jun. 27, 2001

(65) Prior Publication Data

US 2001/0054930 A1 Dec. 27, 2001

(30) Foreign Application Priority Data

Jun. 27, 2000 (DE) .......................... 100 31 190

(51) Int. Cl.$^7$ ................................. H03F 1/02
(52) U.S. Cl. ........................ 330/9; 330/282; 330/284; 327/337; 327/345
(58) Field of Search ............ 330/9, 282, 284, 330/291, 293, 294, 382; 327/337, 345, 554

(56) References Cited

U.S. PATENT DOCUMENTS

| | | | | |
|---|---|---|---|---|
| 4,623,854 A | * | 11/1986 | Kuraishi | 330/9 |
| 4,791,379 A | * | 12/1988 | Hughes | 327/337 |
| 5,245,646 A | * | 9/1993 | Jackson et al. | 327/337 |
| 5,680,070 A | * | 10/1997 | Anderson et al. | 327/337 |
| 5,724,000 A | * | 3/1998 | Quinn | 327/554 |
| 5,999,042 A | * | 12/1999 | Hemdal et al. | 327/554 |
| 6,198,329 B1 | * | 3/2001 | Ezell et al. | 327/307 |

FOREIGN PATENT DOCUMENTS

| | | |
|---|---|---|
| DE | 196 53 191 A1 | 7/1998 |
| DE | 198 33 968 A1 | 2/2000 |
| JP | 63 204 911 A | 8/1988 |

* cited by examiner

Primary Examiner—Tuan T. Lam
(74) Attorney, Agent, or Firm—Laurence A. Greenberg; Werner H. Stemer; Ralph E. Locher (57) ABSTRACT

A compensation circuit for attenuating or eliminating undesired properties of an operational amplifier and a corresponding compensation method determine conditions which are established inside or outside the operational amplifier and which allow to draw conclusions as to the presence and/or the degree of the undesired properties of the operational amplifier. The compensation circuit is controlled as a function of the determined conditions.

24 Claims, 3 Drawing Sheets

CIRCUIT AND METHOD FOR ATTENUATING OR ELIMINATING UNDESIRED PROPERTIES OF AN OPERATIONAL AMPLIFIER

BACKGROUND OF THE INVENTION

Field of the Invention

The invention relates to a compensation circuit for attenuating or eliminating undesired properties of an operational amplifier and to a corresponding method for attenuating or eliminating undesired properties of an operational amplifier.

A variety of embodiments of operational amplifiers have been known for many years. An ideal operational amplifier has an infinitely high input resistance over the entire frequency axis, no output resistance, an infinitely high amplification and a number of further ideal properties.

However, in reality, operational amplifiers are not ideal. The aforementioned properties deviate from the ideal case to a greater or lesser extent, and these deviations are frequently also non-linear.

It is particularly unfortunate here that a phase shift which depends on the frequency of the input signals occurs between the input signals and the output signal of the operational amplifier. This phase shift can have the effect that negative feedback from the output terminal of the operational amplifier to its inverting input terminal becomes positive feedback as a result of which the operational amplifier becomes unstable. In order to avoid this, the frequency response must be corrected. During this correction, it is ensured that the gain factor of the operational amplifier is reduced to values which are less than 1 for frequencies at which the phase shift assumes values an which can be critical for the stability of the operational amplifier.

For this purpose, the configuration and/or the external wiring of the operational amplifier must be changed, the change usually including the addition of a capacitor. One of the best known possible ways of performing a frequency response correction is known as Miller compensation.

Figure 1:
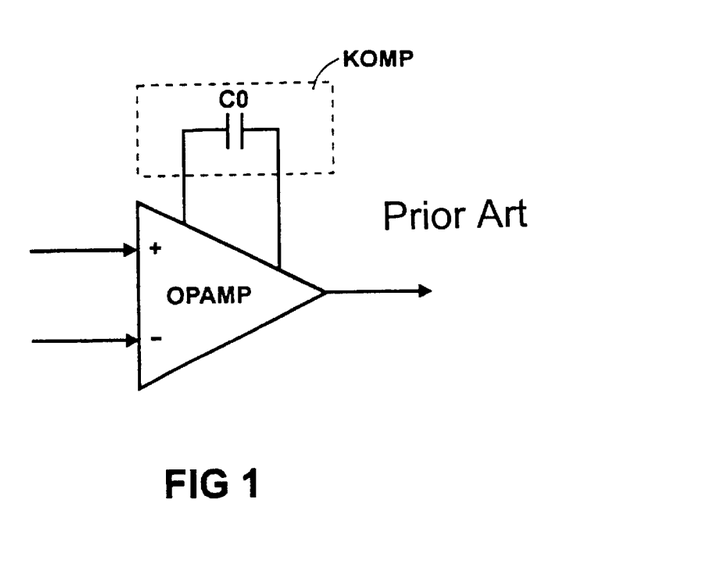
FIG. 1 is a schematic circuit diagram of a configuration containing an operational amplifier and a conventional compensation circuit for correcting the frequency response of the operational amplifier.

FIG. 1 is a schematic representation of an operational amplifier with a compensation circuit which is used for frequency response correction. Here, the operational amplifier is designated by the reference OPAMP, and the compensation circuit is designated by the reference KOMP. The compensation circuit KOMP is formed in the example in question of a capacitor C0 whose terminals are connected to selected points inside the operational amplifier OPAMP.

The compensation circuit KOMP ensures that the operational amplifier is operated with a sufficiently high phase reserve, and thus operates in a stable fashion under all circumstances.

However, the compensation circuit KOMP also has effects on other parameters of the operational amplifier. The (compensation) capacitance of the capacitor C0 acts, inter alia, on the slew rate and the gain-bandwidth product of the operational amplifier.

The slew rate is generally proportional to I/C, largely independently of the topology of the circuit, and the gain-bandwidth product is proportional to Gm/C, I being the available current, Gm being the steepness of the transistors contained in the operational amplifier and C the compensation capacitance, also largely independently of the topology of the circuit. As the compensation capacitance C becomes larger, the slew rate and the amplification-bandwidth product therefore drop. This cannot generally be compensated by an increase in I or Gm because the technology is usually already operating at the limit of what is feasible.

Good (high) values for the slew rate and the gain-bandwidth product can therefore be achieved only if the compensation capacitance C is not too high. On the other hand, the compensation capacitance C must, however, not be too small because otherwise there is the risk of the operational amplifier becoming unstable.

For this reason, there is an optimum value or value range for the compensation capacitance C, and this value or value range should not, or must not, be significantly undershot or exceeded.

It becomes apparent that this is very difficult in particular if the capacitor is integrated into an integrated circuit which forms or contains the operational amplifier. The capacitances of the capacitors which are integrated into integrated circuits can in fact have very high tolerances (up to ±40%). Although the capacitors can be adjusted to the desired capacitance, for example by trimming with a laser, this process is very complex and expensive. A possible alternative to this is to provide the capacitor outside the integrated circuit which forms or contains the operational amplifier. However, it is then complicated and costly to use the operational amplifier.

Such problems and similar problems may occur not only in the case of frequency response correction but also when other undesired properties of the operational amplifier are attenuated or eliminated.

SUMMARY OF THE INVENTION

It is accordingly an object of the invention to provide a compensation circuit for attenuating or eliminating undesired properties of an operational amplifier and a method for attenuating or eliminating undesired properties of an operational amplifier which overcome the above-mentioned disadvantages of the heretofore-known circuits and methods of this general type and which reduce or eliminate the undesired properties of the operational amplifier as required in a reliable and easy fashion and which involve only little outlay.

With the foregoing and other objects in view there is provided, in accordance with the invention, a compensation circuit for attenuating or eliminating undesired properties of an operational amplifier, including:

a plurality of compensation circuit elements; and at least some of the compensation circuit elements having at least one property selected from the group consisting of being selectively activatable and deactivatable, being connectable to the operational amplifier, and being connectable in different ways to respective other ones of the compensation circuit elements.

In other words, the compensation circuit according to the invention is defined by the fact that its elements can be activated and deactivated at least partly selectively and/or can be connected in different ways to other elements of the compensation circuit and/or to the operational amplifier.

As a result it is possible to ensure that the operational amplifier always operates in a fast and stable fashion as requested under all circumstances even if the elements which are required for compensation can be manufactured only with large tolerances. It is even possible to perform dynamic adaptation to the respective current conditions and requirements.

According to another feature of the invention, the operational amplifier has a given frequency response, and the compensation circuit elements correct the given frequency response of the operational amplifier.

According to yet another feature of the invention, a regulator is operatively connected to at least some of the compensation circuit elements, and the regulator configures the compensation circuit according to given specifications.

According to a further feature of the invention, the regulator configures the compensation circuit such that the operational amplifier operates in a fast and stable manner according to given requirements.

According to another feature of the invention, the operational amplifier has a transient response with a given duration and a given profile, and the regulator configures the compensation circuit as a function of at least one characteristic selected from the group consisting of the given duration and the given profile of the transient response of the operational amplifier.

According to yet another feature of the invention, the operational amplifier has input terminals, and the regulator determines the given duration and the given profile of the transient response from a ratio of magnitudes of voltages established at the input terminals of the operational amplifier.

According to another feature of the invention, the regulator operates based on the assumption that the transient response is still occurring if the voltages established at the input terminals of the operational amplifier are not of a substantially same magnitude.

According to a further feature of the invention, the regulator operates based on the assumption that the transient response has ended if the voltages established at the input terminals of the operational amplifier have substantially a same magnitude.

According to yet a further feature of the invention, the regulator operates based on the assumption that the operational amplifier is unstable if the voltages established at the input terminals of the operational amplifier alternately have substantially a same magnitude and different magnitudes.

According to another feature of the invention, at least some of the compensation circuit elements together define a given capacitance present in the compensation circuit, and the regulator reduces the given capacitance if the given duration of the transient response exceeds an upper limiting value.

According to yet another feature of the invention, at least some of the compensation circuit elements together define a given capacitance present in the compensation circuit, and the regulator increases the given capacitance if the operational amplifier is unstable.

According to a further feature of the invention, at least some of the compensation circuit elements together define a given capacitance present in the compensation circuit, and the regulator increases the given capacitance if the given duration of the transient response drops below a lower limiting value.

According to yet a further feature of the invention, the regulator adjusts the compensation circuit during a normal operation of the operational amplifier.

With the objects of the invention in view there is also provided, a method for attenuating or eliminating undesired properties of an operational amplifier, the method includes the steps of:

ascertaining given conditions selected from the group consisting of conditions established inside an operational amplifier and conditions established outside the operational amplifier such that the given conditions allow to draw conclusions about a characteristic of undesired properties of the operational amplifier, the characteristic being selected from the group consisting of a presence of the undesired properties and an extent of the undesired properties of the operational amplifier; and controlling a compensation circuit in dependence of a result of the ascertaining step for performing a function selected from the group consisting of attenuating the undesired properties and eliminating the undesired properties of the operational amplifier.

In other words, the method according to the invention is defined by the fact that conditions which are established inside or outside the operational amplifier and which permit At conclusions to be drawn as to the presence and/or the degree of the undesired properties of the operational amplifier are determined, and thus a compensation circuit which is provided for attenuating or eliminating the undesired properties of the operational amplifier is controlled as a function of the result of the determination.

According to another mode of the invention, the step of controlling the compensation circuit includes at least one step selected from the group consisting of activating circuit elements contained in the compensation circuit, deactivating circuit elements contained in the compensation circuit, changing a connection between circuit elements contained in the compensation circuit and other circuit elements contained in the compensation circuit, and changing a connection between circuit elements contained in the compensation circuit and the operational amplifier.

Another mode of the invention includes the step of actuating switching elements provided in the compensation circuit in order to control the compensation circuit.

Yet another mode of the invention includes the step of controlling the compensation circuit such that the operational amplifier operates in a fast and stable fashion as requested.

A further mode of the invention includes the step of ascertaining whether the operational amplifier is operating in a fast and stable fashion according to the given requirements from at least one response characteristic selected from the group consisting of a duration of a transient response of the operational amplifier and a profile of the transient response of the operational amplifier.

A further mode of the invention includes the step of ascertaining the at least one response characteristic from a ratio of magnitudes of voltages established at input terminals of the operational amplifier.

Another mode of the invention includes the step of concluding that the transient response is still occurring if the voltages established at the input terminals of the operational amplifier are not substantially of a same magnitude.

Yet another mode of the invention includes the step of concluding that the transient response has ended if the voltages established at the input terminals of the operational amplifier are substantially of a same magnitude.

A further mode of the invention includes the step of concluding that the operational amplifier is unstable if the voltages established at the input terminals of the operational it amplifier are alternately substantially of a same magnitude and of different magnitudes.

Yet a further mode of the invention includes the step of reducing a capacitance present in the compensation circuit if the duration of the transient response exceeds an upper limiting value.

According to another mode of the invention, the step of reducing the capacitance present in the compensation circuit includes deactivating an activated capacitor.

Yet another mode of the invention includes the step of increasing a capacitance present in the compensation circuit if the operational amplifier is unstable.

A further mode of the invention includes the step of increasing a capacitance present in the compensation circuit if the duration of the transient response drops below a lower limiting value.

According to another mode of the invention, the step of increasing the capacitance includes activating a non-activated capacitor.

Another mode of the invention includes the step of adjusting the compensation circuit during a normal operation of the operational amplifier.

Other features which are considered as characteristic for the invention are set forth in the appended claims.

Although the invention is illustrated and described herein as embodied in a circuit and a method for attenuating or eliminating undesired properties of an operational amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings, the compensation circuit according to the invention is described in detail. According to the invention, it is intended to influence the frequency response of an operational amplifier through the use of the compensation circuit described in more detail below and the method described in more detail below so that the operational amplifier has a phase reserve of such a magnitude that it operates in a stable fashion under all circumstances. The particular features of the compensation circuit and of the method which are described below can, however, also be used in compensation circuits and methods which are intended to attenuate or eliminate any other undesired properties of an operational amplifier.

In the example in question, the frequency response is corrected through the use of what is referred to as Miller compensation. This is done by inserting a capacitor between two selected points of the operational amplifier. The particular features of the compensation circuit and of the method which are described below can, however, also be used in compensation circuits and methods which bring about the correction of the frequency response in some other way.

The compensation circuit in question has the particular feature that the elements of the compensation circuit can be activated and deactivated at least partly selectively and/or can be connected in different ways to other elements of the compensation circuit and/or to the operational amplifier.

Whether elements of the compensation circuit are activated or deactivated, and if so which elements these are, and/or which elements are connected to other elements of the compensation circuit and/or to the operational amplifier depends on conditions which are established inside or outside the operational amplifier and which allow conclusions to be drawn as to the presence and/or the degree of the undesired properties of the operational amplifier. These conditions are determined and the compensation circuit is controlled as a function of them.

Figure 2:
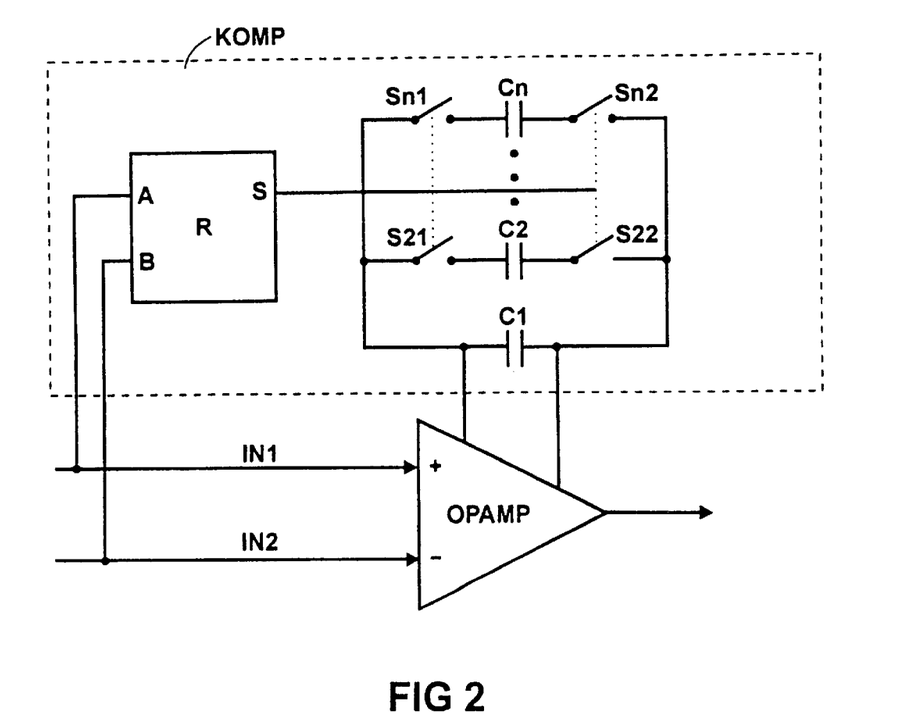
FIG. 2 is a schematic circuit diagram of a configuration containing an operational amplifier and the compensation circuit according to the invention as described in more detail below for correcting the frequency response of the operational amplifier.

An operational amplifier which is provided with such a compensation circuit is illustrated in FIG. 2. Here, the operational amplifier is designated again by the reference OPAMP, and the compensation circuit is designated again by the reference KOMP.

In the example in question, the operational amplifier OPAMP is embodied as an integrated circuit or as a component of an integrated circuit. The compensation circuit KOMP is accommodated on the integrated circuit containing the operational amplifier. The operational amplifier and/or the compensation circuit can, however, also be provided on different integrated circuits, and can also be embodied as normal (non-integrated) circuits independently of one another.

The operational amplifier OPAMP is a "normal" operational amplifier which does not have to have any particular features.

The compensation circuit KOMP differs, however, from the conventional compensation circuit according to FIG. 1. Instead of just one capacitor C0, it has a plurality of capacitors C1 to Cn which are connected in parallel, and additionally contains a regulator R through the use of which individual capacitors, several capacitors, or all the capacitors, of the capacitors C1 to Cn can be activated and deactivated.

The capacitors may have the same capacitances or different capacitances.

In the example in question, "only" the capacitors C2 to Cn can be activated and deactivated; the capacitor C1 is always active and cannot be switched off. As has already been indicated, there is no restriction to this. Basically, any desired capacitors and any desired number of capacitors (even all of them) may be capacitors which can be activated and deactivated.

In order to activate and deactivate the capacitors C2 to Cn, switches are provided in the branches containing the capacitors C2 to Cn, on both sides of the capacitors. The switches are designated in FIG. 2 by S21 and S22 (for the capacitor C2) and Sn1 and Sn2 (for the capacitor Cn). In the activated state of the capacitors, the switches which are assigned to them are closed, as a result of which the respective capacitors are connected in parallel with the capacitor C1 and the further activated capacitors, and the capacitances of these capacitors are added to one another; in the deactivated state of the capacitors, the switches which are assigned to them are opened, as a result of which these capacitors do not have any effect.

The opening and closing of the switches S21 to Sn2 is carried out by the controller R. The controller is capable of activating and deactivating the capacitors C2 to Cn individually and independently of one another. Here, the switches which are assigned to a capacitor, that is to say, for example, the switches S21 and S22 or the switches Sn1 and Sn2 are each opened or closed simultaneously.

The regulator R opens and closes the switches S21 to Sn2 as a function of whether or not the operational amplifier is operating in a fast and stable fashion as required; for this purpose, the regulator R determines certain conditions which permit conclusions to be drawn as to whether or not the operational amplifier is operating in a stable fashion, and the regulator controls the switches S21 to Sn2 as a function of the result of the determination.

The conditions which are determined in order to be able to decide whether or not the operational amplifier is operating in a fast and stable fashion according to requirements are, in the example in question, the duration and/or in the profile of the transient response of the operational amplifier. The duration and/or the profile of the transient response are determined in the example in question by reference to the ratios of the magnitudes or of the variation over time of the ratio of the magnitudes of the voltages which are established at the input terminals IN1 and IN2 of the operational amplifier. In an operational amplifier with negative feedback this ratio of the magnitudes or the variation (temporal course) of this ratio over time is a reliable criterion to determine whether the operational amplifier is operating in a fast and stable fashion according to requirements: if the voltages which are established at the input terminals IN1 and IN2 of the operational amplifier are of approximately the same magnitude, the operational amplifier is in the steady state; if the voltages are unequal when the conditions at the operational amplifier are not changing, or are changing only slowly, or if the voltages are alternately identical and not identical, the operational amplifier is not (yet) in the steady state or the operational amplifier is unstable.

The evaluation of the ratio of the magnitudes of the voltages which are established at the input terminals IN1 and IN2 of the operational amplifier, or of the variation over time of the magnitudes can be evaluated in different ways.

A first possible way is to determine the time which passes until the voltages which are established at the input terminals IN1 and IN2 of the operational amplifier are of the same magnitude again after an event which results in a change in these voltages which destroys the equilibrium of the operational amplifier, and to check, (1) whether the time which is determined is longer or shorter than a maximum duration (which can preferably be defined and/or varied according to requirements), and (2) whether the ratio of the magnitudes of the voltages which are established at the input terminals IN1 and IN2 of the operational amplifier (when the conditions at the operational amplifier are not changing, or are only changing slowly) remains the same thereafter.

From the result of the first check (1) it is possible to determine whether the operational amplifier is operating sufficiently quickly. If the time which is determined is longer than the defined maximum duration, the operational amplifier is operating too slowly. This can be corrected by switching off one or more of the capacitors C2 to Cn (by opening the associated switches).

From the result of the second check (2) it is possible to determine whether the operational amplifier is operating stably. If the voltages which are established at the input terminals IN1 and IN2 of the operational amplifier alternate quickly between being equal and unequal, this indicates that the operational amplifier is oscillating. If this oscillation does not decay, the operational amplifier is unstable (has become an oscillator). This can be corrected by connecting one or more of the capacitors C2 to Cn (by closing the associated switches).

Instead of the second check (2) it is possible to provide a check as to whether the time which is determined (the time which passes until the voltages which are established at the input terminals IN1 and IN2 of the operational amplifier are of the same magnitude again after an event which results in a change in these voltages which destroys the equilibrium of the operational amplifier) is shorter than a minimum duration (which can preferably be defined and/or varied according to requirements).

From the above it is also possible to determine whether the operational amplifier is operating in a stable fashion. If the time which is determined is shorter than the defined minimum duration, the operational amplifier is apparently operating unstably. This conclusion is justified because a short duration of the transient response of the operational amplifier makes it possible to conclude that the compensation capacitance is very small and, because a compensation capacitance that is too small or very small cannot be reliably excluded, that the operational amplifier is becoming unstable.

In the example in question, the first check (1) which is mentioned above and the alternative second check which has just been described are carried out; the execution of these checks is carried out in the regulator R.

Figure 3:
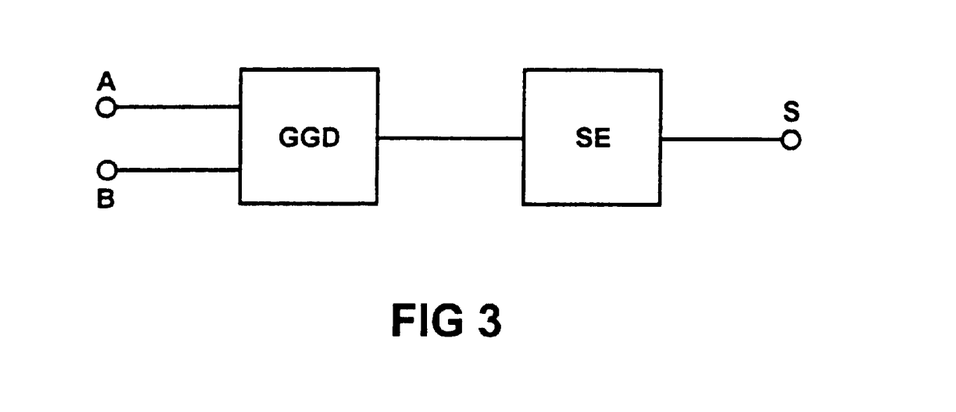
FIG. 3 is a schematic block diagram of a regulator R as shown in FIG. 2.

A possible configuration of the regulator R is illustrated in FIG. 3; it contains an equilibrium detector GGD with terminals A and B and a controller SE with a terminal S.

The equilibrium detector GGD determines whether or not the voltages which are established at the input terminals IN1 and IN2 of the operational amplifier are approximately of the same magnitude, and transmits the result, designated by GG in the figures, to the controller SE. The controller SE measures the time which passes, after an event which results in a change in the voltages applied to the input terminals IN1 and IN2 of the operational amplifier which destroys the equilibrium of the operational amplifier, until the voltages which are established at the input terminals IN1 and IN2 of the operational amplifier are approximately of the same magnitude again, and controls the switches S21 to Sn2 as a function thereof.

Figure 4:
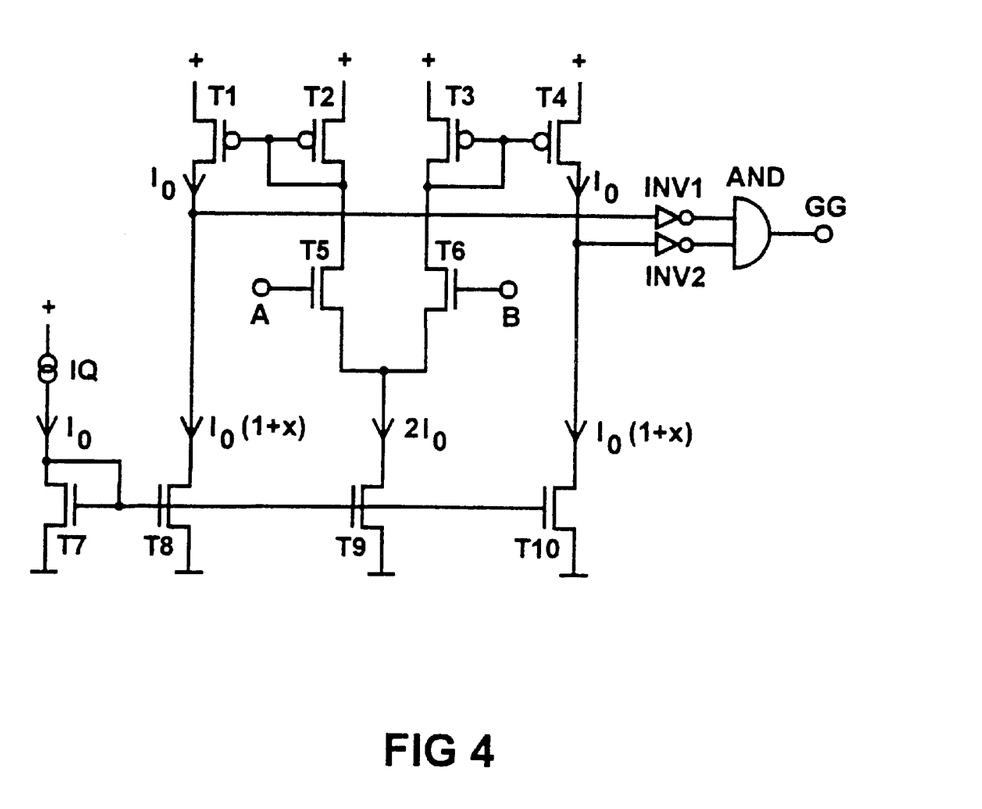
FIG. 4 is a schematic circuit diagram of an equilibrium detector GGD as shown in FIG. 3.

A possible configuration of the equilibrium detector GGD is illustrated in FIG. 4.

The equilibrium detector GGD is formed, in the example in question, of transistors T1 to T10, a current source IQ, inverters INV1 and INV2, and an AND element AND, which are connected as shown in FIG. 4.

Figure 5:
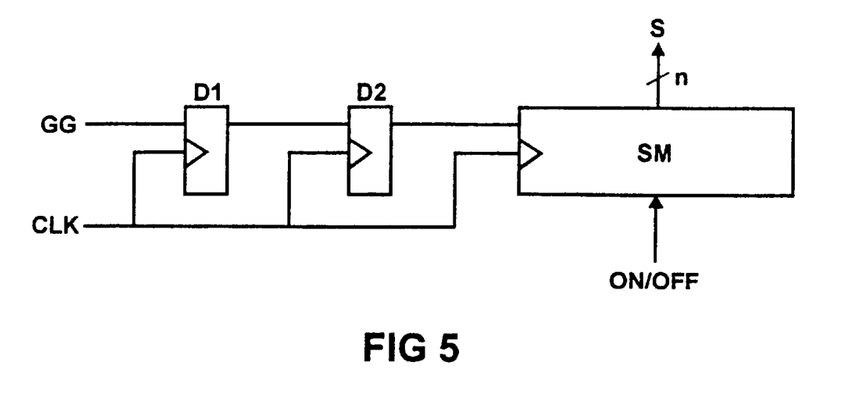
FIG. 5 is a schematic block diagram of a controller SE as shown in FIG. 3.

This is a differentiator stage or differential stage which makes it possible to determine whether the voltages which are present at the input terminals IN1 and IN2 of the operational amplifier and which are fed to the equilibrium detector GGD via input terminals A and B thereof are of identical magnitude. A signal GG=1 is output if the voltages which are established at the input terminals IN1 and IN2 of the operational amplifier are approximately of the same magnitude, and a signal GG=0 is output if the voltages which are established at the input terminals IN1 and IN2 of the operational amplifier are of different magnitudes; the difference between the voltages which must be exceeded for the voltages which are established at the input terminals IN1 and IN2 of the operational amplifier to be classified as unequal can be adjusted through the use of the W/L ratios of the transistors T7 to T10 which are connected to form a current mirror. The currents in the circuit shown in FIG. 4 are designated as $I_0$, $2I_0$, and $I_0(1+x)$ A possible configuration of the controller SE is shown in FIG. 5.

In the example in question, the controller SE includes two D-flipflops D1 and D2 and what is referred to as a state machine SM, the D-flipflops D1 and D2 and the state machine SM being supplied with a common clock CLK.

The D-flipflops D1 and D2 are used to synchronize the equilibrium detector GGD and the controller SE.

In the state machine SM, it is determined (after triggering through the use of a signal ON/OFF on the basis of the output signal GG, fed to the state machine via the D-flipflops, of the equilibrium detector GGD whether capacitors are to be activated and deactivated (by opening and closing the switches S21 to Sn2 assigned to the respective capacitors), and if so which of the capacitors present these are.

Figure 6:
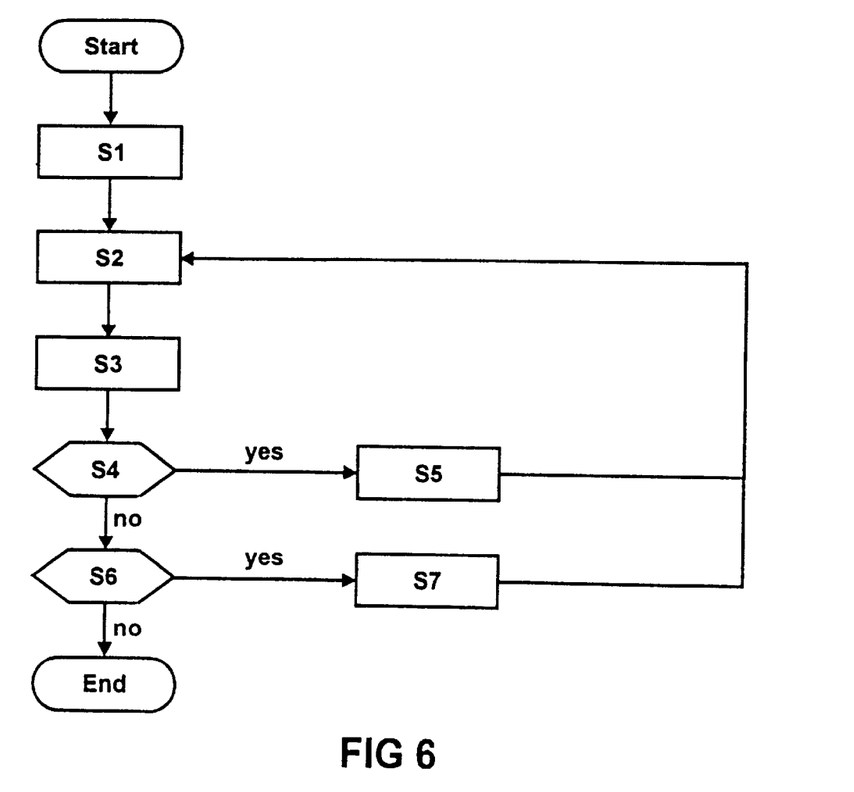
FIG. 6 is a flowchart illustrating the function of a state machine contained in the controller SE.

The state machine SM operates in the example in question as illustrated in the flowchart in FIG. 6.

Accordingly, the state machine SM first waits for the selfadjustment which it is to carry out (step S1). The time at which the selfadjustment is to be started is signaled to the state machine SM by the already mentioned signal ON/OFF which is supplied to it from the outside.

If the state machine SM has been signaled through the use of the signal ON/OFF that a selfadjustment is to be carried out, it waits for an event which results (step S2) in a change in the voltages present at the input terminals IN1 and IN2 of the operational amplifier which destroys the equilibrium of the operational amplifier. This event has occurred if the signal GG supplied to the state machine SM by the equilibrium detector GGD jumps from the level 1 to the level 0.

Then, the state machine SM waits for the time at which the signal GG supplied to the state machine SM by the equilibrium detector GGD jumps from the level 0 to the level 1, and determines the (waiting) time which has passed until this has occurred (step S3).

Subsequently, in step 4, the state machine SM checks whether the waiting time determined in step S3 is longer than an upper limiting value for the waiting time (an upper limiting value for the duration of the transient response).

If the waiting time is longer than the upper limiting value, the state machine SM disconnects one or more of the capacitors is C2 to Cn from the circuit by opening the associated switches, and thus reduces the effective compensation capacitance (step S5); after this there is a jump back to the step S2.

If the waiting time is not longer than the upper limiting value, the state machine SM checks, in step S6, whether the waiting time is shorter than a lower limiting value for the waiting time (a lower limiting value for the duration of the transient response).

If the waiting time is shorter than the lower limiting value, the state machine SM connects one or more of the capacitors C2 to Cn to the circuit by closing the associated switches, and thus increases the effective compensation capacitance (step S7); there is then a jump back to the step S2.

If the waiting time is not shorter than the lower limiting value, that is to say if the waiting time lies between the upper limiting value and the lower limiting value, the compensation capacitance is set such that the operational amplifier operates in a fast and stable fashion as is desired. The selfadjustment is thus ended; the state machine SM jumps back to the step Si where it waits for an instruction for a renewed selfadjustment.

It is clear that the procedure during the selfadjustment can be modified in many ways. In particular, if the capacitors C2 to Cn which can be connected into the circuit and disconnected from the circuit have different capacitances, it may prove advantageous if the magnitude of the difference between the waiting time and the limiting values determines which capacitor or which capacitors is/are respectively connected into the circuit or disconnected from the circuit, and/or if a reduction in the effective compensation capacitance (step S5) is brought about by virtue of the fact that one or more capacitors is/are disconnected from the circuit, and at the same time one or a plurality of capacitors with an overall lower capacitance is/are connected into the circuit, and/or if an increase in the effective compensation capacitance (step S7) is brought about by virtue of the fact that one or more capacitors is/are disconnected from the circuit, and at the same time one or more capacitors with an overall higher capacitance is/are connected into the circuit.

The selfadjustment does not need to be carried out under the control of the state machine SM; the sequence control can also be carried out by any desired other device, even by a program-controlled unit such as a microprocessor or microcontroller.

In the statements above it has been assumed that during the selfadjustment the operational amplifier receives input signals which change with a speed and to an extent such as can be expected during normal operation of the operational amplifier. As a result, the selfadjustment takes place under conditions such as also occur during normal operation of the operational amplifier.

In many systems there are inherently sufficiently fast and extensive changes of the input signals during the selfadjustment.

If this is not the case, appropriate signals must be fed in during the selfadjustment. These signals can be, for example, square wave signals. Such signals can be generated and fed in during the selfadjustment without difficulty, and no further explanation is required.

In many operational amplifiers, the operational amplifier can be made to execute a transient response with sufficient amplitude, so that the process of selfadjustment supplies its own stimulus signal, only by connecting the capacitors C2 to Cn into the circuit, or disconnecting them from it. This applies in particular if the capacitors which are to be connected into the circuit are charged by a special charging device before the connection into the circuit.

The selfadjustment can in principle be carried out at any desired times and as often as desired.

The selfadjustment is completely without problems and generally without any negative effect on the system containing the operational amplifier if the adjustment is carried out immediately after the system is switched on.

The selfadjustment can, however, also first be carried out at later times, or be carried out again without disrupting the operation of the system containing the operational amplifier.

This can be done without difficulty especially in systems which operate in discrete time. Here all that is necessary is to ensure that the selfadjustment is carried out at times at which the operational amplifier (its output signal) is not required at that particular time.

A selfadjustment which takes place while the operational amplifier is operating is, however, also frequently possible in systems which operate continuously over time. Operational amplifiers used in such systems are not required at all times either, or can be adjusted at intermediate times, as described. This is the case, for example, if, for example as in the case of the preamplifier of an A/D converter, the output signal of the operational amplifier is required or is sampled only at specific times. Here too, a selfadjustment can be carried out at times at which the operational amplifier (its output signal) is not currently required.

It is also possible to provide that the selfadjustment is not carried out at the operational amplifier which is currently operating but rather at a second operational amplifier of identical configuration, and then the configuration of the configuration circuit which results in such a case is transmitted to the first operational amplifier at a suitable time, or the operational amplifiers are interchanged by switching over the signal paths.

It would also be possible to provide for the selfadjustment to be carried out only in certain test phases, and for the settings which are determined in the process to be stored in a non-volatile memory. It would also be possible here to store a plurality of sets for settings which can then be used selectively (for example as a function of temperature). It would then no longer be necessary to perform any further checks during the normal operation of the operational amplifier; the information required for configuring the compensation circuit could be read out of the non-volatile memory.

It would also be conceivable to replace the switches S21 to Sn2 completely or partially by fuses.

In the same way as the capacitors can be connected into the circuit and disconnected in the compensation circuit described above, any desired other electrical components, such as resistors, coils, diodes, transistors, etc., can also be connected into the circuit or disconnected selectively and independently of one another.

In addition, or as an alternative, signal paths can also be switched over.

Of course, these settings may be made not only as a function of the transient response of the operational amplifier but also as a function of any desired other properties or parameters.

Through the use of the described compensation circuit and the described compensation method it is possible to ensure, even if the elements required for the compensation can be manufactured only with large tolerances, that the operational amplifier always operates in a fast and stable fashion according to requirements under all circumstances. It is even possible to perform a dynamic adaptation to the respective current conditions and requirements.

I claim:

1. In combination with a back-coupled operational amplifier having undesired properties, the operational amplifier having a transient response with a given duration and a given profile and input terminals a compensation circuit for one of attenuating and eliminating the undesired properties of the operational amplifier, the compensation circuit comprising:

a plurality of compensation circuit elements, at least some of said compensation circuit elements having at least one property selected from the group consisting of being selectively activatable and deactivatable, being connectable to the operational amplifier, and being connectable in different ways to respective other ones of said compensation circuit elements;

a regulator operatively connected to at least some of said compensation circuit elements, said regulator configuring the compensation circuit as a function of at least one characteristic selected from the group consisting of the given duration and the given profile of the transient response of the operational amplifier, said regulator determining the given duration and the given profile of the transient response from a ratio of magnitudes of voltages established at the input terminals of the operational amplifier.

2. The compensation circuit according to claim 1, wherein:

the operational amplifier has a given frequency response; and said compensation circuit elements correct the given frequency response of the operational amplifier.

3. The compensation circuit according to claim 1, wherein said regulator configures the compensation circuit such that the operational amplifier operates in a fast and stable manner according to given requirements.

4. The compensation circuit according to claim 1, wherein said regulator operates based on the assumption that the transient response is still occurring when the voltages established at the input terminals of the operational amplifier are not of a substantially same magnitude.

5. The compensation circuit according to claim 1, wherein said regulator operates based on the assumption that the transient response has ended when the voltages established at the input terminals of the operational amplifier have substantially a same magnitude.

6. The compensation circuit according to claim 1, wherein said regulator operates based on the assumption that the operational amplifier is unstable when the voltages established at the input terminals of the operational amplifier alternately have substantially a same magnitude and different magnitudes.

7. The compensation circuit according to claim 1, wherein:

at least some of said compensation circuit elements together define a given capacitance present in the compensation circuit; and said regulator reduces the given capacitance when the given duration of the transient response exceeds an upper limiting value.

8. The compensation circuit according to claim 1, wherein:

at least some of said compensation circuit elements together define a given capacitance present in the compensation circuit; and said regulator increases the given capacitance when the operational amplifier is unstable.

9. The compensation circuit according to claim 1, wherein:

at least some of said compensation circuit elements together define a given capacitance present in the compensation circuit; and said regulator increases the given capacitance when the given duration of the transient response drops below a lower limiting value.

10. The compensation circuit according to claim 1, wherein said regulator adjusts the compensation circuit during a normal operation of the operational amplifier.

11. A method for one of attenuating and eliminating undesired properties of a back-coupled operational amplifier, the operational amplifier having a transient response with a given duration and a given profile and input terminals, the method which comprises:

ascertaining given conditions selected from the group consisting of conditions established inside the operational amplifier and conditions established outside the operational amplifier such that the given conditions allow to draw conclusions about a characteristic of undesired properties of the operational amplifier, the characteristic being selected from the group consisting of a presence of the undesired properties and an extent of the undesired properties of the operational amplifier; and controlling a compensation circuit having a plurality of compensation circuit elements in dependence of a result of the ascertaining step for performing a function selected from the group consisting of attenuating the undesired properties and eliminating the undesired properties of the operational amplifier, the step of controlling the compensation circuit including at least one step selected from the group consisting of activating circuit elements contained in the compensation circuit, deactivating circuit elements contained in the compensation circuit, changing a connection between circuit elements contained in the compensation circuit and other circuit elements contained in the compensation circuit, and changing a connection between circuit elements contained in the compensation circuit and the operational amplifier; and configuring a regulator operatively connected to at least some of the compensation circuit elements according to given specifications as a function of at least one response characteristic selected from the group consisting of the given duration of the transient response of the operational amplifier and the given profile of the transient response of the operational amplifier, ascertaining the at least one response characteristic from a ratio of magnitudes of voltages established at the input terminals of the operational amplifier.

12. The method according to claim 11, wherein the step of controlling the compensation circuit includes at least one step selected from the group consisting of activating circuit elements contained in the compensation circuit, deactivating circuit elements contained in the compensation circuit, changing a connection between circuit elements contained in the compensation circuit and other circuit elements contained in the compensation circuit, and changing a connection between circuit elements contained in the compensation circuit and the operational amplifier.

13. The method according to claim 11, which comprises actuating switching elements provided in the compensation circuit in order to control the compensation circuit.

14. The method according to claims 11, which comprises controlling the compensation circuit such that the operational amplifier operates in a fast and stable fashion according to given requirements.

15. The method according to claim 14, which comprises concluding that the transient response is still occurring when the voltages established at the input terminals of the operational amplifier are not substantially of a same magnitude.

16. The method according to claim 11, which comprises concluding that the transient response has ended when the voltages established at the input terminals of the operational amplifier are substantially of a same magnitude.

17. The method according to claim 11, which comprises concluding that the operational amplifier is unstable when the voltages established at the input terminals of the operational amplifier are alternately substantially of a sane magnitude and of different magnitudes.

18. The method according to claim 15, which comprises reducing a capacitance present in the compensation circuit when the duration of the transient response exceeds an upper limiting value.

19. The method according to claim 18, wherein the step of reducing the capacitance present in the compensation circuit includes deactivating an activated capacitor.

20. The method according to claim 17, which comprises increasing a capacitance present in the compensation circuit when the operational amplifier is unstable.

21. The method according to claim 15, which comprises increasing a capacitance present in the compensation circuit when the duration of the transient response drops below a lower limiting value.

22. The method according to claim 16, which comprises increasing a capacitance present in the compensation circuit when the duration of the transient response drops below a lower limiting value.

23. The method according to claim 21, wherein the step of increasing the capacitance includes activating a non-activated capacitor.

24. The method according to claim 11, which comprises adjusting the compensation circuit during a normal operation of the operational amplifier.

* * * * *

UNITED STATES PATENT AND TRADEMARK OFFICE
CERTIFICATE OF CORRECTION

PATENT NO.    : 6,509,792 B2
DATED         : January 21, 2003
INVENTOR(S)   : Bernhard Engl It is certified that error appears in the above-identified patent and that said Letters Patent is hereby corrected as shown below:

<u>Column 11,</u>
Line 55, should read as follows -- profile and input terminals, a compensation circuit for one of --

<u>Column 14,</u>
Line 4, should read as follows -- 14. The method according to claim 11, which comprises --
Line 8, should read as follows -- 15. The method according to claim 11, which comprises --
Line 18, should read as follows -- tional amplifier are alternately substantially of a same mag- --

Signed and Sealed this

Twenty-second Day of July, 2003

JAMES E. ROGAN
*Director of the United States Patent and Trademark Office*